(12) United States Patent
Lee et al.

(10) Patent No.: US 6,586,340 B2
(45) Date of Patent: Jul. 1, 2003

(54) WAFER PROCESSING APPARATUS AND WAFER PROCESSING METHOD USING THE SAME

(75) Inventors: Jong-myeong Lee, Kyungki-do (KR); Byung-hee Kim, Seoul (KR); Myoung bum Lee, Seoul (KR); Ju-young Yun, Seoul (KR); Gil-heyun Choi, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/098,029

(22) Filed: Mar. 13, 2002

(65) Prior Publication Data

US 2002/0132487 A1 Sep. 19, 2002

(30) Foreign Application Priority Data

Mar. 13, 2001 (KR) .......................................... 2001-12901

(51) Int. Cl.[7] ...................... H01L 21/302; H01L 21/461
(52) U.S. Cl. ........................ 438/715; 438/737; 438/974
(58) Field of Search ................................. 438/715, 716, 438/737, 770, 775, 974, 765

(56) References Cited

U.S. PATENT DOCUMENTS 4,951,601 A    8/1990   Maydan et al.
5,981,399 A  * 11/1999   Kawamura et al.
6,001,736 A   12/1999   Kondo et al.
6,391,769 B1 *  5/2002   Lee et al.

* cited by examiner

*Primary Examiner*—David Nelms
*Assistant Examiner*—Phuc T. Dang
(74) *Attorney, Agent, or Firm*—Myers Bigel Sibley & Sajovec

(57) ABSTRACT

An integrated in situ cluster type wafer processing apparatus which can be used for forming metal wiring layers having a multi-layered structure and a wafer processing method using the same are provided. The wafer processing apparatus includes a transfer chamber which can be exhausted and has a plurality of gate valves, a plurality of vacuum processing chambers each of which can be connected to the transfer chamber via one of the gate valves, and a load lock chamber which can be exhausted and is connectable to a first gas feed line for feeding an oxygen-based gas into the load lock chamber. In a wafer processing method, a predetermined layer is formed on a wafer in one of the vacuum processing chambers. The predetermined layer on the wafer is oxidized in the load lock chamber or an oxygen atmosphere chamber.

19 Claims, 7 Drawing Sheets

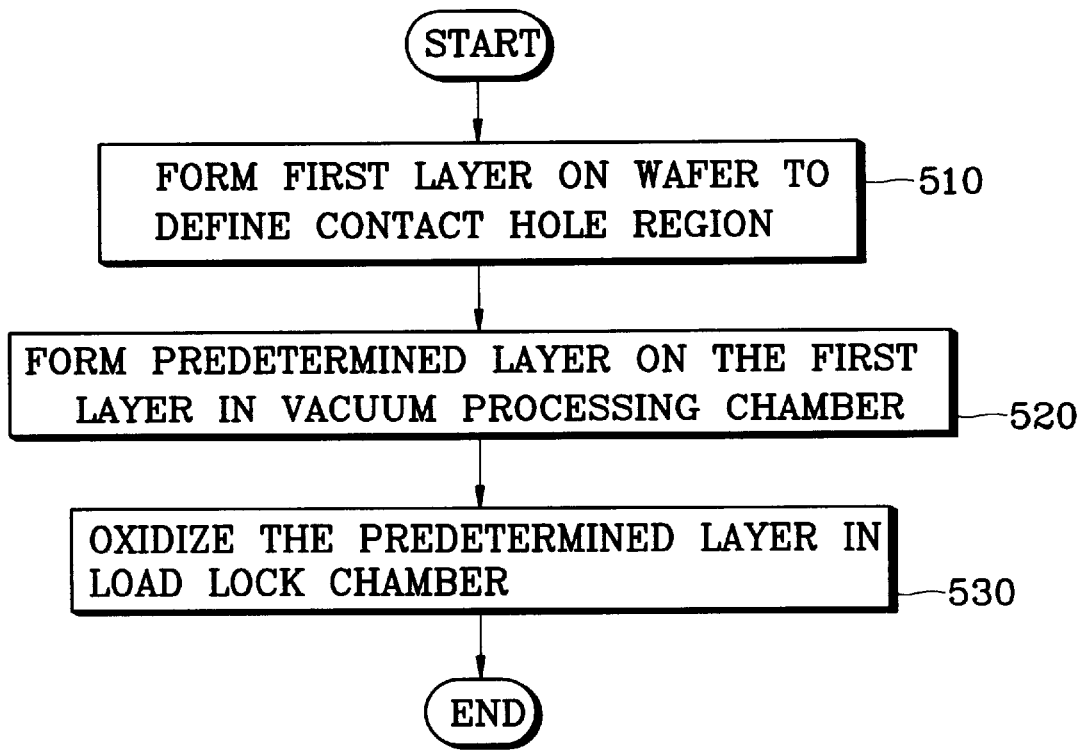
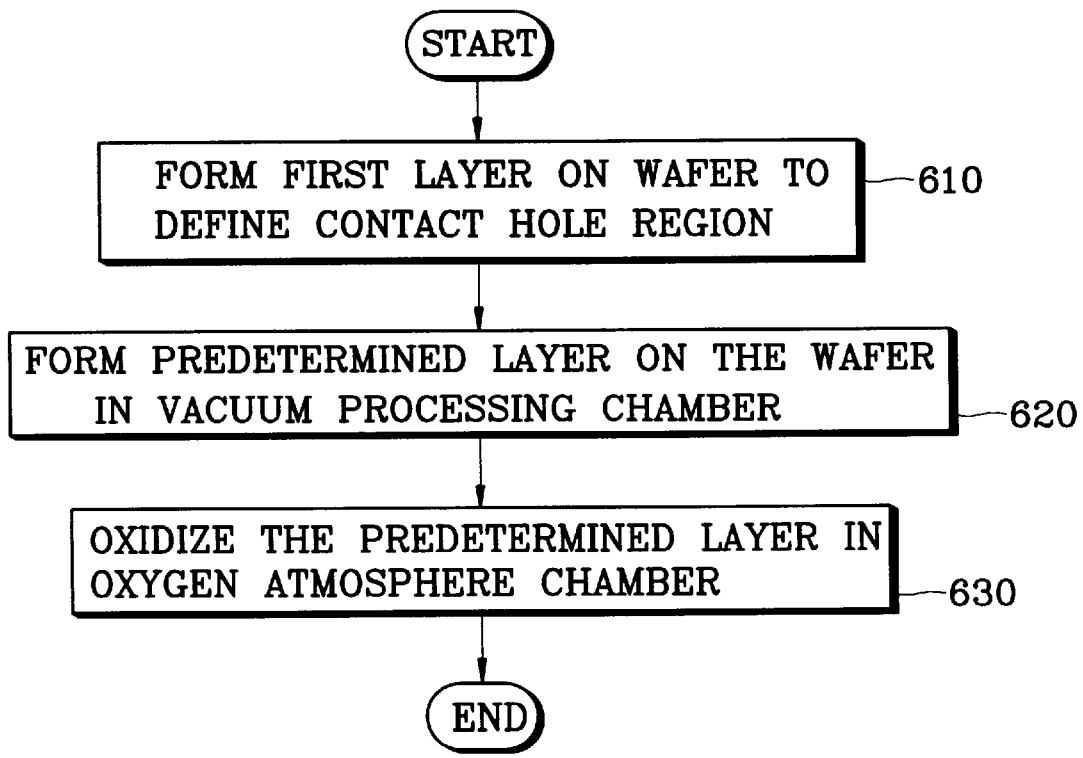

WAFER PROCESSING APPARATUS AND WAFER PROCESSING METHOD USING THE SAME

RELATED APPLICATION

This application claims the benefit of Korean Patent Application No. 2001-12901, filed Mar. 13, 2001, the disclosure of which is hereby incorporated herein by reference in its entirety as if set forth fully herein.

BACKGROUND OF THE INVENTION

1. Field of the Invention

The present invention relates to a wafer processing apparatus and a wafer processing method using the same, and more particularly, to a wafer processing apparatus which can be used to form metal wiring layers having a multi-layered structure and a wafer processing method using the same.

2. Description of the Related Art

As the integration density of semiconductor devices increases, it is necessary to introduce metal wiring layers having a multi-layered structure into circuits. Because metal wiring layers transmit electrical signals, it is advantageous to use an economical material for the metal wiring layers which has low electrical resistance and high reliability. To meet these demands, aluminum is widely used for the material of the metal wiring layers. It is also advantageous to electrically connect such aluminum wiring layers in a way that is reliable, economical, and has low electrical resistance. Metal wiring layers are typically connected by a contact hole, which is a contact between a lower device and an upper wiring layer, or a via hole, which is a contact between a lower metal wiring layer and an upper aluminum wiring layer. Aluminum is preferably used as the metal to fill a contact hole or a via hole because it is economical and has superior conductivity.

To obtain superior electrical characteristics and filling characteristics when filling a contact hole or a via hole with aluminum, a variety of processing techniques have been developed. The processes for filling a contact hole or a via hole typically include steps such as chemical vapor deposition (CVD), physical vapor deposition (PVD), heat treatment, an oxidation process, and an etching process. Various cluster tool type wafer processing apparatuses have been developed to perform the steps for filling a contact hole or via hole.

However, a conventional integrated cluster tool type wafer processing apparatus typically does not have every facility required for performing all the processes for filling a contact hole or a via hole on a wafer. Accordingly, a vacuum break inevitably occurs during the contact hole or via hole filling processes. If a wafer is exposed to the atmosphere during the processes for filling a contact hole or a via hole, the exposed surface of the wafer may be contaminated by air, water vapor, or particles in the air, which may adversely affect the performance and yield of the resulting semiconductor device. In addition, the distance the wafer moves is increased significantly because the wafer is moved into a processing equipment or processing atmosphere which is not installed in the wafer processing apparatus during the contact hole or via hole filling process and through put is decreased.

SUMMARY OF THE INVENTION

According to certain embodiments of the invention, a wafer processing apparatus includes: a transfer chamber which is exhaustible and has a plurality of gate valves; a plurality of vacuum processing chambers, each of which is connectable to the transfer chamber via one of the gate valves; and a load lock chamber which is exhaustible and is connectable to a first gas feed line for feeding an oxygen-based gas into the load lock chamber.

In some embodiments, a second gas feed line for feeding an inert gas into the load lock chamber is connectable to the load lock chamber.

The plurality of vacuum processing chambers may include a chemical vapor deposition chamber, a physical vapor deposition chamber, and a heat treatment chamber.

The heat treatment chamber may include a pedestal which can be raised and lowered and has a supporting surface for supporting a wafer. A cover is installed above the pedestal so that a predetermined space between the supporting surface and the cover can be adjusted by raising and lowering the pedestal. A heating apparatus for heating the wafer is installed at the pedestal and the cover.

The plurality of vacuum processing chambers may include a Ti/TiN layer exclusive chamber for forming a Ti layer, a TiN layer, or a mixed layer of Ti and TiN. The plurality of vacuum processing chambers may include an etching chamber. The etching chamber may be a plasma etching chamber using a radio frequency power source. Alternatively, the etching chamber may be an electron cyclotron resonance etching chamber.

In certain embodiments, a wafer processing apparatus according to the invention includes an oxygen atmosphere chamber which can be connected to the transfer chamber via one of the gate valves. In some embodiments, the oxygen atmosphere chamber includes a third gas feed line for feeding an oxygen-based gas into the oxygen atmosphere chamber and a fourth gas feed line for feeding an inert gas into the oxygen atmosphere chamber.

The wafer processing apparatus according to the invention may further include: a degas chamber which is situated between the load lock chamber and the transfer chamber and is used for preheating a wafer received from the load lock chamber and for outgassing; and a cooling chamber which is situated between the load lock chamber and the transfer chamber and is used for cooling the wafer received from the transfer chamber.

According to embodiments of the invention, a wafer processing apparatus includes: a transfer chamber which is exhaustible and has a plurality of gate valves; a plurality of vacuum processing chambers, each of which is connected to the transfer chamber via one of the gate valves; an oxygen atmosphere chamber which can be connected to the transfer chamber via one of the gate valves and is connectable to a first gas feed line for feeding an oxygen-based gas into the oxygen atmosphere chamber; and a load lock chamber which is exhaustible.

According to embodiments of the invention, a transfer chamber is connected to a plurality of processing chambers via a plurality of gate valves. A load lock chamber is connected to the transfer chamber, and a first gas feed line is connected to the load lock chamber for feeding an oxygen-based gas to the load lock chamber. A predetermined layer is formed in one of the plurality of vacuum processing chambers. The predetermined layer is oxidized on the wafer in the load lock chamber. The load lock chamber and the transfer chamber are exhaustible.

The step of oxidizing the predetermined layer on the wafer may be performed in an oxygen-based gas atmosphere including at least one of oxygen ($O_2$), ozone ($O_3$), and dinitrogen monoxide ($N_2O$). The step of oxidizing the predetermined layer on the wafer may be performed in a mixed gas atmosphere of an inert gas and an oxygen-based gas including at least one of oxygen ($O_2$), ozone ($O_3$), and dinitrogen monoxide ($N_2O$). The step of oxidizing the predetermined layer on the wafer may be performed at a temperature between about room temperature and about 200° C.

According to embodiments of the invention, a first layer is formed on a predetermined portion of the wafer to define a contact hole or via hole region before the step of forming the predetermined layer, and the predetermined layer is formed on the first layer such that the predetermined layer does not cover the contact hole region.

According to embodiments of the invention, a transfer chamber is connected to a plurality of vacuum processing chambers via a plurality of gate valves. An oxygen atmosphere chamber is connected to the transfer chamber via one of the plurality of gate valves. A first gas feed line to the oxygen atmosphere chamber for feeding an oxygen-based gas into the oxygen atmosphere chamber. A load lock chamber is connected to the transfer chamber for facilitating the transfer of a wafer to and from the transfer chamber. The transfer chamber and the load lock chamber is exhaustible.

According to certain embodiments of the invention, exposure to the atmosphere during processing and during the formation of metal wiring layers is eliminated. Therefore, contamination of the wafer may be reduced and throughput may be enhanced.

BRIEF DESCRIPTION OF THE DRAWINGS

FIG. 7 is a flowchart illustrating a wafer processing method according to method embodiments of the present invention; and FIG. 8 is a flowchart illustrating a wafer processing method according to method embodiments of the present invention.

DETAILED DESCRIPTION OF THE INVENTION

Figure 1:
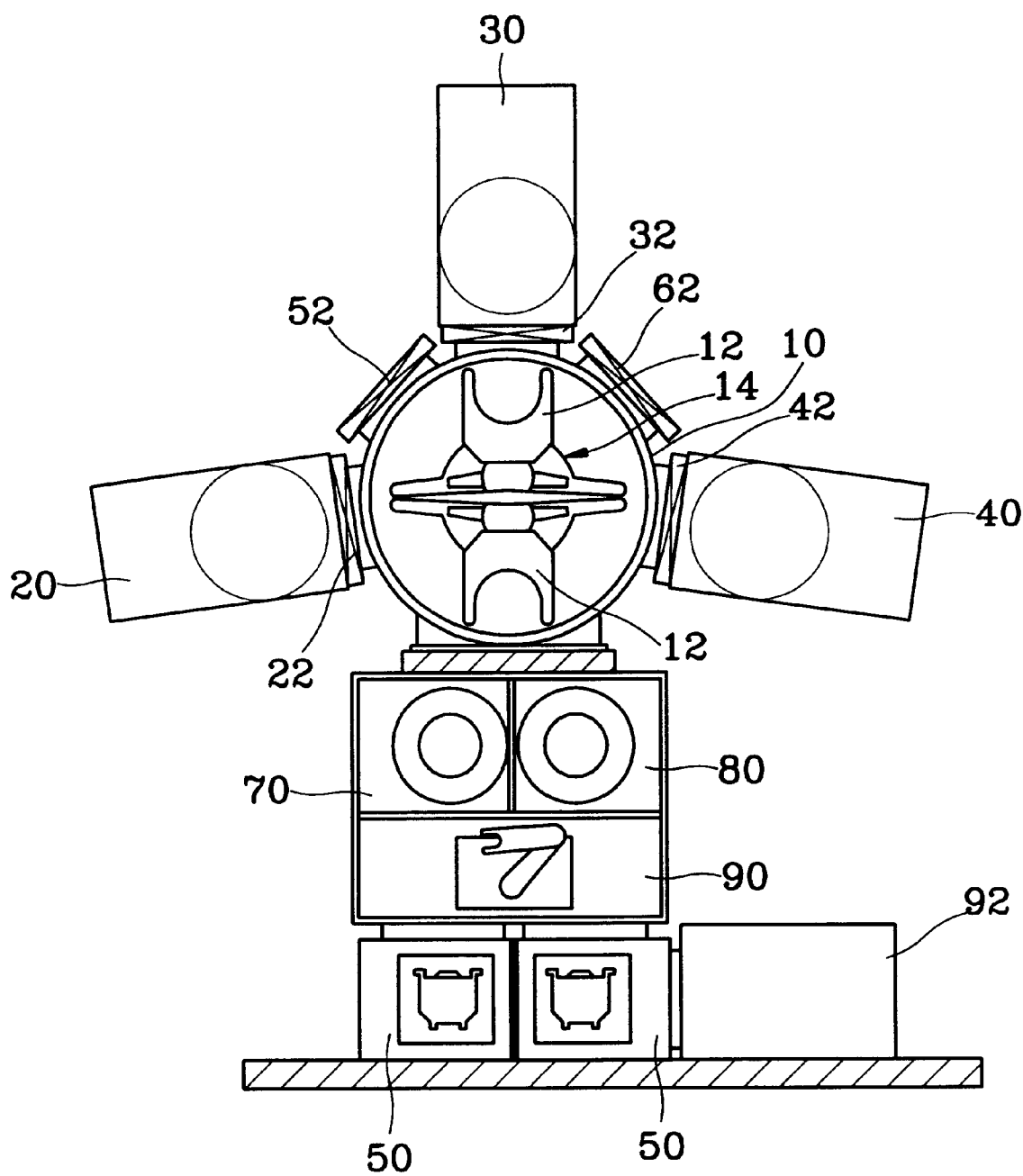
FIG. 1 is a schematic diagram of an integrated in situ cluster tool type wafer processing apparatus according to embodiments of the present invention.

The present invention now will be described more fully hereinafter with reference to the accompanying drawings, in which various embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of elements may be exaggerated for clarity. It will be understood that when an element is referred to as being "connected" or "connectable to" another element, it can be directly connected to the other element or intervening elements may also be present.

FIG. 1 is a schematic diagram illustrating an integrated in situ cluster tool type wafer processing apparatus according to embodiments of the present invention. Referring to FIG. 1, a wafer processing apparatus according to an embodiment of the present invention includes a transfer chamber 10 having a plurality of gate valves 22, 32, 42, 52, and 62. A wafer handling robot 14 is installed in the transfer chamber 10. The wafer handling robot 14 includes a blade 12 for supporting a wafer. A plurality of vacuum processing chambers 20, 30, and 40 are installed around the transfer chamber 10, and each of the vacuum processing chambers 20, 30, and 40 is connected to the transfer chamber 10 through one of the gate valves 22, 32, 42, 52, and 62. In FIG. 1, the vacuum processing chambers 20, 30, and 40 are a chemical vapor deposition (CVD) chamber, a physical vapor deposition (PVD) chamber, and a heat treatment chamber, respectively.

The CVD chamber 20 can be used for forming a metal layer such as an aluminum layer or an aluminum alloy layer. For example, selective metal organic chemical vapor deposition (MOCVD) for forming an aluminum layer can be performed in the CVD chamber 20. The CVD chamber 20 includes a raw material provider (not shown) for providing an aluminum source for providing aluminum as well as processing gases required for deposition of an aluminum layer in the CVD chamber 20. A precursor formed of an organometallic compound, such as dimethylaluminum hydride (DMAH), trimethylamine alane (TMAA), dimethylethylamine alane (DMEAA), or methylpyrrolidine alane (MPA), may be used as the aluminum source. A bubbler type raw material provider, a vapor flow controller type raw material provider, or a liquid delivery system type raw material provider may be used for providing the precursor to the CVD chamber 20. An inert gas, such as Ar, may be used as a dilution gas. To promote the decomposition of the precursor, a reaction gas, such as a hydrogen ($H_2$) gas, may be added.

The PVD chamber 30 may be a sputtering chamber which is capable of performing direct current (DC) sputtering, DC magnetron sputtering, alternating current (AC) sputtering, or AC magnetron sputtering. If necessary, a collimator may be installed in the PVD chamber 30 for performing sputtering. The PVD chamber 30 can be used for forming a wiring layer, which includes an aluminum layer or an aluminum alloy layer.

The wiring layer is thermally treated in an inert atmosphere, such as an Ar atmosphere, at a temperature of 350° C. or greater for several minutes and then is reflowed to fill a contact hole or via hole and planarize the wiring layer. The heat treatment chamber 40 is used to perform the reflowing process. Heat treatment for reflowing the aluminum layer or aluminum alloy layer should be performed in a state when the surface of the aluminum layer or aluminum alloy layer is difficult to oxidize. Thus, it is preferable that the pressure of the heat treatment chamber 40 is low. Preferably, the heat treatment chamber is maintained to be in a highly vacuum state having a pressure of $10^{-6}$ Torr or less.

Figure 2A:
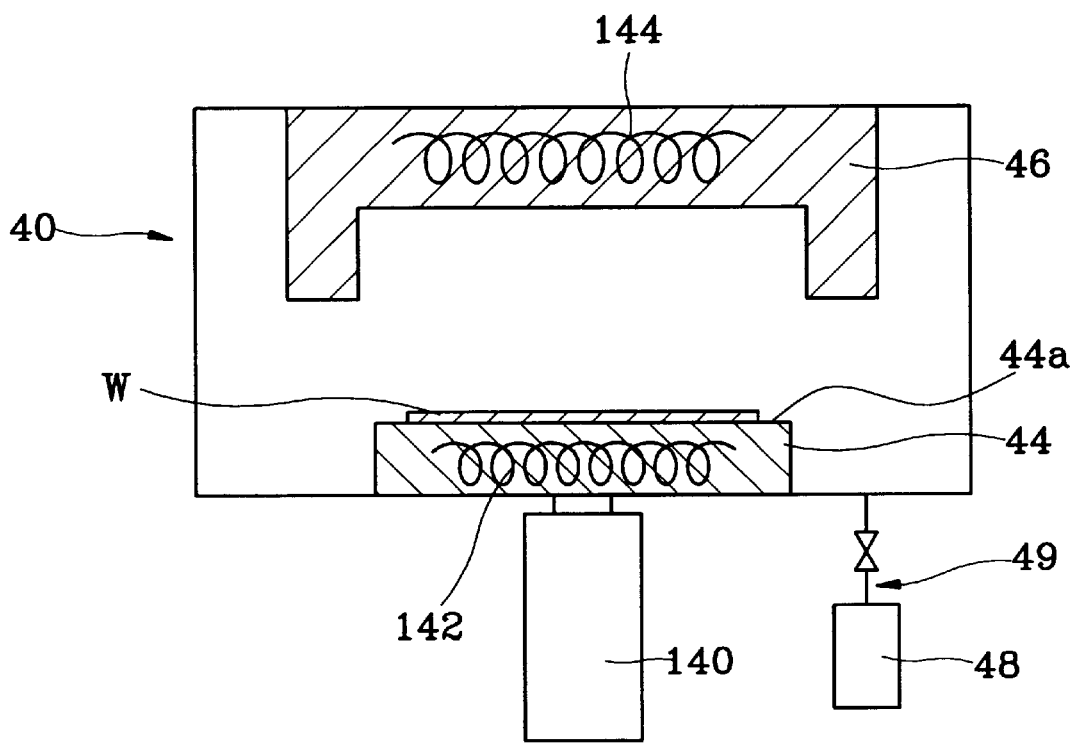
FIGS. 2A and 2B are schematic diagrams of a heat treatment chamber installed in an integrated cluster tool type wafer processing apparatus according to embodiments of the present invention.
Figure 2B:
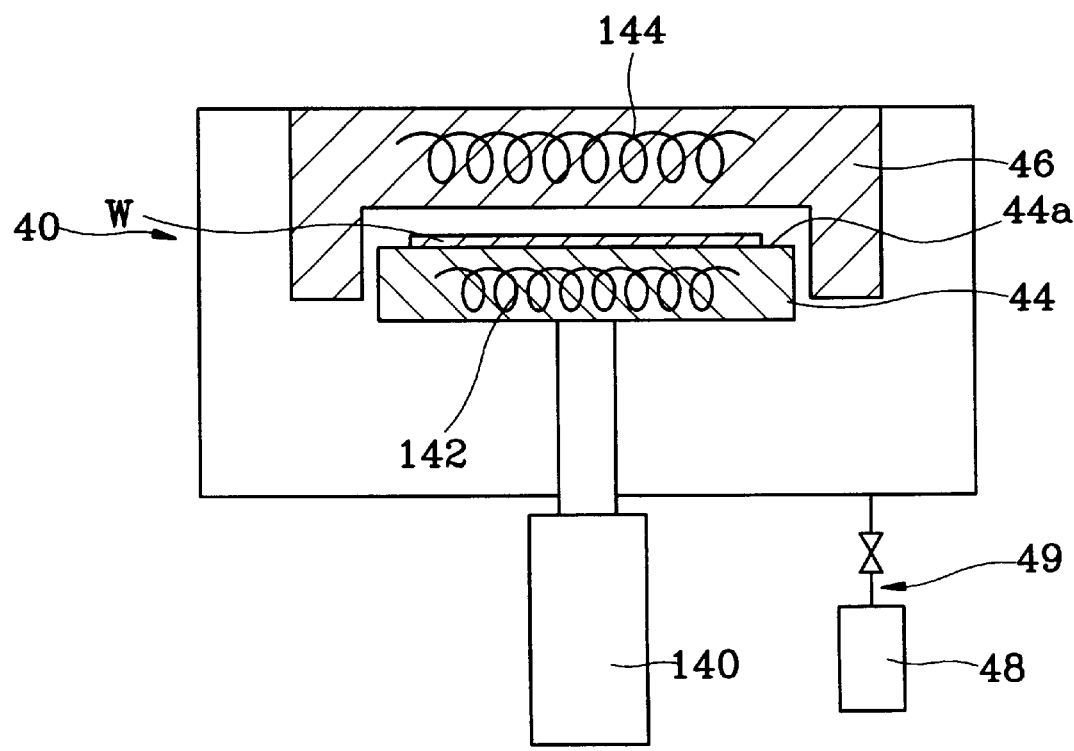

FIGS. 2A and 2B are schematic diagrams illustrating the structure of the heat treatment chamber 40 of FIG. 1. Referring to FIGS. 2A and 2B, the heat treatment chamber 40 includes a pedestal 44 having a supporting surface 44a for supporting a wafer W. The pedestal 44 can be raised and lowered by an elevating apparatus 140. FIG. 2A illustrates the case of the pedestal 44 in a lowered position, and FIG. 2B illustrates the case of the pedestal 44 in a raised position. The heat treatment chamber 40 includes a cover 46 which is installed above the pedestal 44 so that a predetermined space between the supporting surface 44a and the cover 46 can be adjusted depending on whether the pedestal 44 is lowered or raised, respectively. A first heater 142 and a second heater 144 are installed in the pedestal 44 and the cover 46, respectively. The first and second heaters 142 and 144 may include a resistant coil. The heat treatment chamber 40 can be exhausted using an exhaust system 49 including an exhaust pump 48.

When the wafer W is put into or taken out of the heat treatment chamber 40, the pedestal 44 is at the lowered position. When the wafer W is thermally treated, the pedestal 44 is at the raised position. Therefore, the predetermined space between the supporting surface 44a and the cover 46 is closed by the pedestal 44 when the wafer W is thermally treated, and thus the temperature around the pedestal 44 is uniformly maintained.

Figure 3:
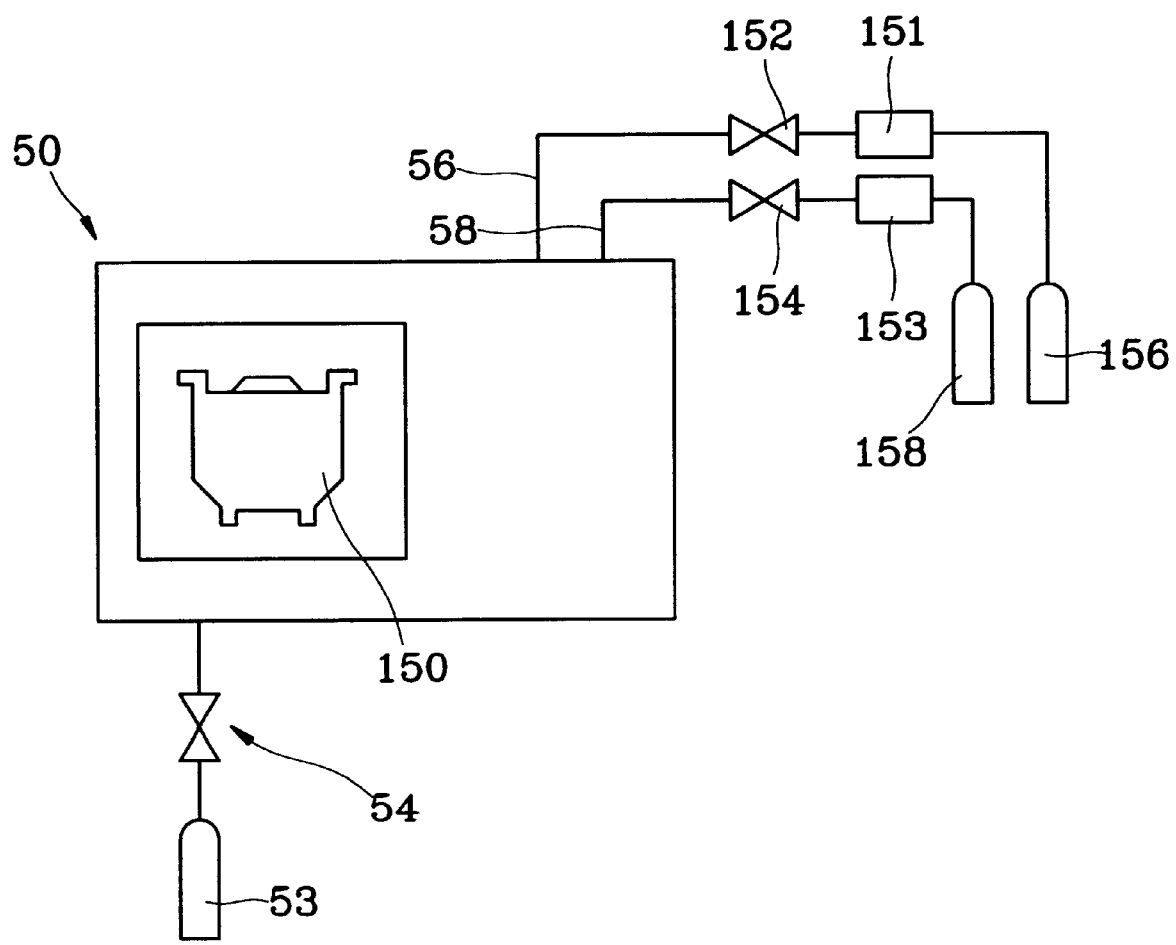
FIG. 3 is a schematic diagram of a load lock chamber installed in an integrated cluster tool type wafer processing apparatus according to embodiments of the present invention.

In addition, the wafer processing apparatus according to the present invention includes a load lock chamber 50 as shown in FIG. 3. In certain embodiments of the present invention, the load lock chamber 50 is used for preparing a space through which a wafer can be moved between the inside and outside of the wafer processing apparatus. The load lock chamber 50 may also be used for oxidizing the wafer.

FIG. 3 is a schematic diagram illustrating the structure of the load lock chamber 50. As shown in FIG. 3, the load lock chamber 50 can be exhausted using an exhaust system 54, which includes an exhaust pump 53. A first gas feed line 56 for feeding an oxygen-based gas 156 to the load lock chamber 50 and a second gas feed line 58 for feeding an inert gas 158 into the load lock chamber 50 are connected to the load lock chamber 50. $O_2$, $O_3$, or $N_2O$ may be used as the oxygen-based gas 156 supplied through the first gas feed line 56. The flow rate of gas supplied via the first and second gas feed lines 56 and 58 can be controlled by flow regulators 151 and 153, respectively, and valves 152 and 154, respectively. Mounted on a wafer carrier 150, a wafer can be easily put into or taken out of the load lock chamber 50. A process for oxidizing the wafer is performed using the oxygen-based gas 156 supplied via the first gas feed line 56 in the load lock chamber 50 maintained in a vacuum state by the exhaust system 54. At this time, it is possible to perform the oxidation of the wafers mounted on the wafer carrier 150 in a batch process. The degree to which the wafer is oxidized can be controlled by regulating the flow rate of the oxygen-based gas 156, that is, by controlling the partial pressure of the oxygen-based gas and the exposure time.

Referring to FIG. 1, a degas chamber 70 is installed between the transfer chamber 10 and the load lock chamber 50 for the purpose of preheating the wafer received from the load lock chamber 50 before moving the wafer to the transfer chamber 10. The degas chamber 70 is also used for outgassing the wafer. A cooling chamber 80 is installed between the transfer chamber 10 and the load lock chamber 50 for the purpose of cooling the wafer before moving the wafer to the load lock chamber 50. Load chambers 90 are buffer chambers situated between the degas chamber 70 and the load lock chamber 50 and between the cooling chamber 80 and the load lock chamber 50. The wafer processing apparatus is controlled by a controller 92.

The wafer processing apparatus shown in FIG. 1, which includes three vacuum processing chambers: the CVD chamber 20, the PVD chamber 30, and the heat treatment chamber 40, can be efficiently used in various processes for forming metal wiring layers such as filling a contact hole or via hole. Also, the wafer processing apparatus shown in FIG. 1 can be used in a blanket aluminum deposition process in which an aluminum layer is formed on a wafer using chemical vapor deposition.

Figure 4:
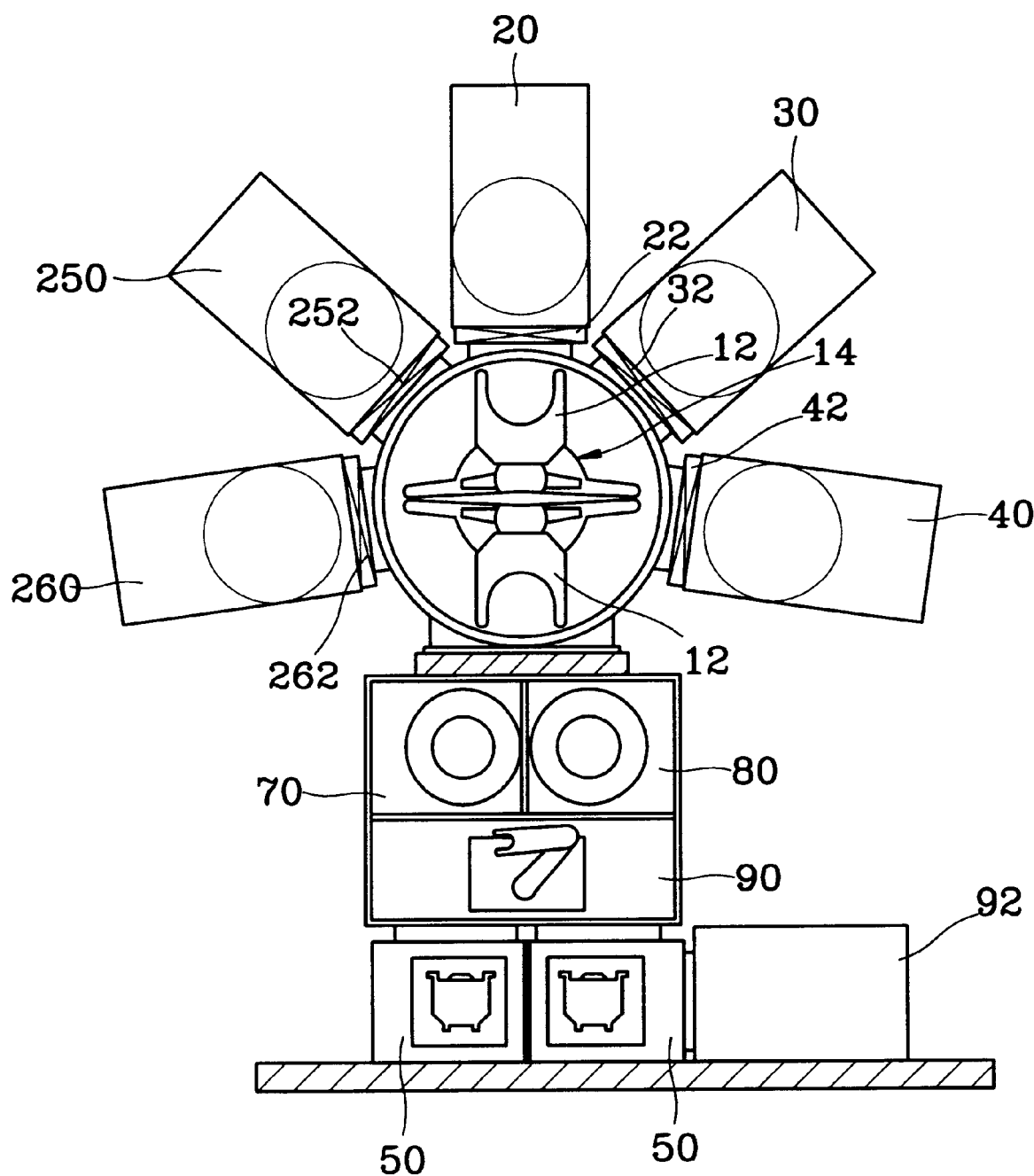
FIG. 4 is a schematic diagram of an integrated cluster tool type wafer processing apparatus according to embodiments of the present invention.

FIG. 4 is a schematic diagram illustrating the structure of an integrated cluster tool type wafer processing apparatus according to further embodiments of the present invention. The same reference numerals in FIGS. 1 and 4 represent the same elements, and thus their description will be omitted.

Referring to FIG. 4, a wafer processing apparatus according to the invention includes the CVD chamber 20, the PVD chamber 30, the heat treatment chamber 40, a Ti/TiN layer exclusive chamber 250 for forming a Ti layer, a TiN layer, or a mixed layer of Ti and TiN, and an etching chamber 260. The Ti/TiN exclusive chamber 250 and the etching chamber 260 are connected to the transfer chamber 10 via gate valves 252 and 262, respectively. The Ti/TiN layer exclusive chamber 250 may include a CVD chamber or a PVD chamber. The etching chamber 260 may include a plasma etching chamber using a radio frequency (RF) power source, or an electron cyclotron resonance (ECR) etching chamber. The etching chamber 260 can be used for removing a surface oxide layer formed in a contact hole or via hole.

Figure 5:
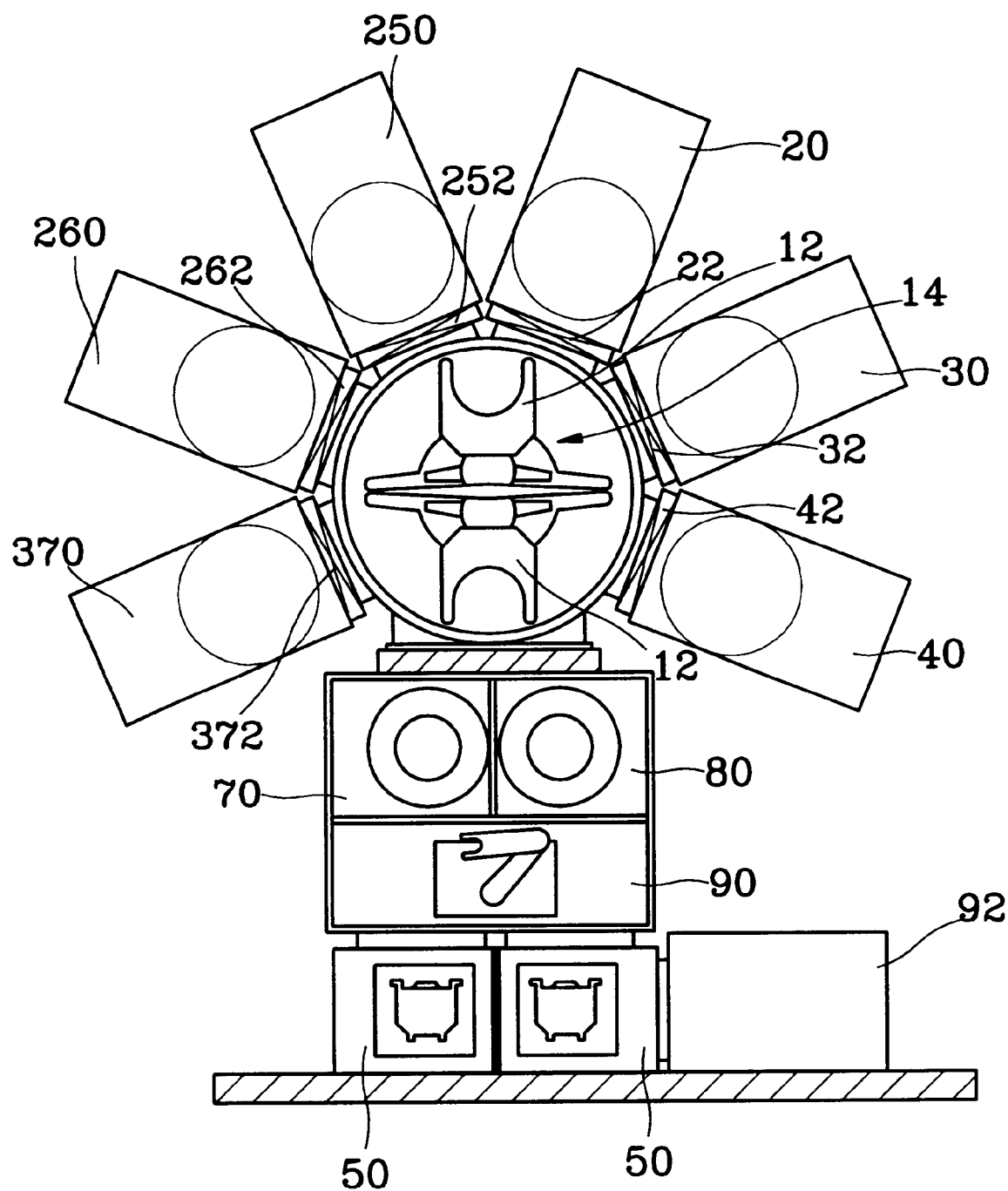
FIG. 5 is a schematic diagram of an integrated cluster tool type wafer processing apparatus according to embodiments of the present invention.

FIG. 5 is a schematic diagram illustrating the structure of an integrated cluster tool type wafer processing apparatus according to embodiments of the present invention. The same reference numerals in FIGS. 1, 4, and 5 represent the same element, and thus their description will not be repeated.

In addition to the vacuum processing chambers, CVD chamber 20, PVD chamber 30, heat treatment chamber 40, Ti/TiN layer exclusive chamber 250, and etching chamber 260, the wafer processing apparatus depicted in FIG. 5 includes an oxygen atmosphere chamber 370. The oxygen atmosphere chamber 370 is connected to the transfer chamber 10 via a gate valve 372.

Figure 6:
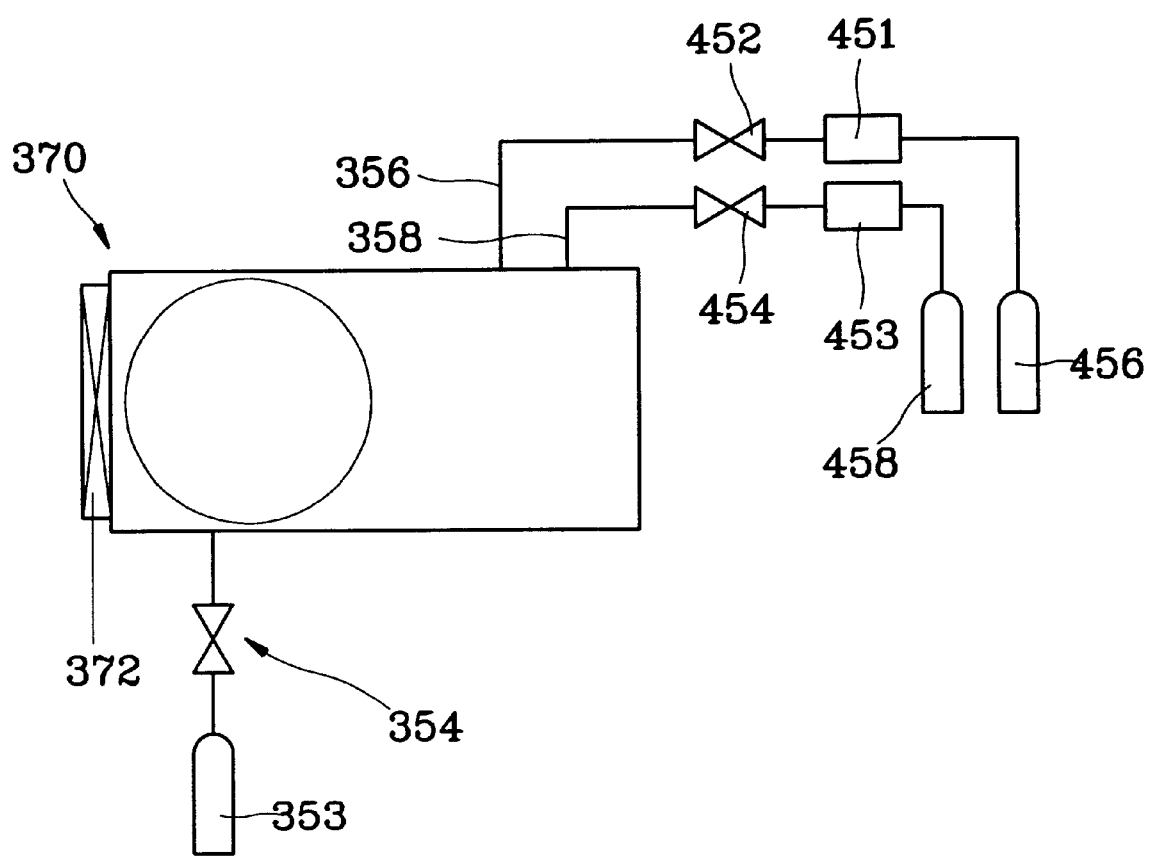
FIG. 6 is a schematic diagram of an oxygen atmosphere chamber installed in an integrated cluster tool type wafer processing apparatus according to embodiments of the present invention.

FIG. 6 is a schematic diagram illustrating the oxygen atmosphere chamber 370 of FIG. 5. As shown in FIG. 6, the oxygen atmosphere chamber 370 can be exhausted by an exhaust system 354 including an exhaust pump 353. A third gas feed line 356 for feeding an oxygen-based gas 456 into the oxygen atmosphere chamber 370 and a fourth gas feed line 358 for feeding an inert gas 458 into the oxygen atmosphere chamber 370 are connected to the oxygen atmosphere chamber 370. The oxygen-based gas 456 is supplied via the third gas feed line 356 may be $O_2$, $O_3$, or $N_2O$. The flow rate of gas supplied via the third and fourth feed lines 356 and 358 can be controlled by flow regulators 451 and 453, respectively, and valves 452 and 454, respectively. A process of oxidizing a wafer may be performed using the oxygen-based gas 456 supplied via the third gas feed line 356 in the oxygen atmosphere chamber 370 maintained in a vacuum state by the exhaust system 354. The degree to which the wafer is oxidized can be controlled by the flow rate of the oxygen-based gas 456, that is, the partial pressure of the oxygen gas and the exposure time.

FIG. 7 is a flowchart illustrating a wafer processing method according to an embodiment of the present invention. The process may be used for forming a contact hole or a via hole. For clarity and ease of presentation, a contact hole is referred to in the following example with reference to FIG. 7. A first layer is formed on a predetermined portion of a wafer to define a contact hole region in step 510. The first layer may be an interlayer dielectric layer, a monolayer formed of a TiN layer, or a mixed layer including a TiN layer. In the case of the first layer being a monolayer of a TiN layer or a mixed layer including a TiN layer, the first layer can be formed in the Ti/TiN layer exclusive chamber 250 of the wafer processing apparatus described with reference to FIG. 4.

Next, in step 520, a predetermined layer, for example, an aluminum layer or a titanium layer, is formed on the first layer using vacuum processing chambers CVD chamber 20 or PVD chamber 30, with reference to FIG. 1. Next, in step 530, the predetermined layer is oxidized in the load lock chamber 50 described with reference to FIGS. 1 and 3. To oxidize the predetermined layer, an oxygen-based gas, such as $O_2$, $O_3$, or $N_2O$, or a mixed gas consisting of the oxygen-based gas and an inert gas is supplied to the load lock chamber 50 so that the load lock chamber 50 is maintained at an oxygen atmosphere. The step of oxidizing the predetermined layer may be performed at a temperature between about room temperature and about 200° C. If necessary, the step of forming an aluminum layer using the CVD chamber 20 or the PVD chamber 30 and the step of reflowing a semiconductor substrate using the heat treatment chamber 40 may be additionally performed.

FIG. 8 is a flowchart illustrating a wafer processing method according to an embodiment of the present invention. The process may be used for forming a contact hole or a via hole. For clarity and ease of presentation, a contact hole is referred to in the following example with reference to FIG. 8. A first layer is formed on a predetermined portion of a wafer so as to define a contact hole region in step 610. As described with reference to FIG. 7, the first layer may be an interlayer dielectric layer, a monolayer formed of a TiN layer, or a mixed layer including a TiN layer.

Next, in step 620, a predetermined layer, for example, an aluminum layer or a titanium layer, is formed on the first layer using the CVD chamber 20 or the PVD chamber 30 installed in the wafer processing apparatus, described with reference to FIG. 5. Next, in step 630, the predetermined layer is oxidized in the oxygen atmosphere chamber 370, described with reference to FIGS. 5 and 6. To oxidize the predetermined layer, an oxygen-based gas or a mixed gas consisting of an oxygen-based gas and an inert gas is fed into the oxygen atmosphere chamber 370 so that the oxygen atmosphere chamber 370 is maintained at an oxygen atmosphere. The step of oxidizing the predetermined layer may be performed at a temperature between about room temperature and about 200° C. If necessary, the step of forming an aluminum layer using the CVD chamber 20 or the PVD chamber 30 and the step of reflowing the semiconductor substrate using the heat treatment chamber 40 may be additionally performed.

According to some embodiments of the present invention, a wafer processing apparatus according to the present invention includes a load lock chamber or an oxygen atmosphere chamber which can be maintained at an oxygen-based atmosphere required for performing an oxidation process. Therefore, the wafer is not exposed to atmosphere when transferred to an oxidation apparatus. The probability of the wafer being polluted is therefore reduced and throughput may be enhanced.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

What is claimed is:

1. A wafer processing method comprising:
   connecting a plurality of vacuum processing chambers to a transfer chamber by one of a plurality of gate valves, wherein the transfer chamber is exhaustible;
   connecting a load lock chamber to the transfer chamber, wherein the load lock chamber is exhaustible;
   connecting a first gas feed line to the load lock chamber for feeding an oxygen-based gas to the load lock chamber;
   forming a predetermined layer on a wafer in one of the plurality of vacuum processing chambers; and
   oxidizing the predetermined layer on the wafer in the load lock chamber.

2. The wafer processing method of claim 1, wherein the step of oxidizing the predetermined layer on the wafer is performed in an oxygen-based gas atmosphere comprising at least one of oxygen ($O_2$), ozone ($O_3$), and dinitrogen monoxide ($N_2O$).

3. The wafer processing method of claim 1, wherein the step of oxidizing the predetermined layer on the wafer is performed in a mixed gas atmosphere of an inert gas and an oxygen-based gas, wherein the oxygen-based gas comprises at least one of one of oxygen ($O_2$), ozone ($O_3$), and dinitrogen monoxide ($N_2O$).

4. The wafer processing method of claim 1, wherein the step of oxidizing the predetermined layer on the wafer is performed at a temperature between about room temperature and about 200° C.

5. The wafer processing method of claim 1, wherein the predetermined layer comprises an aluminum layer.

6. The wafer processing method of claim 1, wherein the predetermined layer comprises a titanium layer.

7. The wafer processing method of claim 1, further comprising:
   forming a first layer on a predetermined portion of the wafer to define a contact hole region before the step of forming the predetermined layer, wherein the predetermined layer is formed on the first layer such that the predetermined layer does not cover the contact hole region.

8. The wafer processing method of claim 7, wherein the first layer comprises an interlayer dielectric layer.

9. The wafer processing method of claim 7, wherein the first layer comprises at least one of a monolayer comprising a TiN layer, and a mixed layer comprising a TiN layer.

10. A wafer processing method, comprising the steps of:
    connecting a transfer chamber to a plurality of vacuum processing chambers via a plurality of gate valves, wherein the transfer chamber is exhaustible;
    connecting an oxygen atmosphere chamber to the transfer chamber via one of the plurality of gate valves;
    connecting a first gas feed line to the oxygen atmosphere chamber for feeding an oxygen-based gas into the oxygen atmosphere chamber;

connecting a load lock chamber to the transfer chamber for facilitating the transfer of a wafer to and from the transfer chamber, wherein the load lock chamber is exhaustible;

forming a predetermined layer on a wafer in one of the vacuum processing chambers; and oxidizing the predetermined layer on the wafer in the oxygen atmosphere chamber.

11. The wafer processing method of claim 10, wherein the step of oxidizing the predetermined layer on the wafer is performed in an oxygen-based gas atmosphere comprising at least one of oxygen ($O_2$), ozone ($O_3$), and dinitrogen monoxide ($N_2O$).

12. The wafer processing method of claim 10, wherein the step of oxidizing the predetermined layer on the wafer is performed in a mixed gas atmosphere comprising an oxygen-based gas comprising at least one of oxygen ($O_2$), ozone ($O_3$), and dinitrogen monoxide ($N_2O$), and an inert gas.

13. The wafer processing method of claim 10, wherein the step of oxidizing the predetermined layer on the wafer is performed at a temperature between about room temperature and about 200° C.

14. The wafer processing method of claim 10, wherein the predetermined layer comprises an aluminum layer.

15. The wafer processing method of claim 10, wherein the predetermined layer comprises a titanium layer.

16. The wafer processing method of claim 10, further comprising:

forming a first layer on a predetermined portion of the wafer to define a contact hole region before the step of forming the predetermined layer, wherein the predetermined layer is formed on the first layer such that the predetermined layer does not cover the contact hole region.

17. The wafer processing method of claim 16, wherein the first layer comprises an interlayer dielectric layer.

18. The wafer processing method of claim 16, wherein the first layer comprises at least one of a monolayer comprising a TiN layer and a mixed layer comprising a TiN layer.

19. A wafer processing method comprising:

connecting a plurality of vacuum processing chambers to a transfer chamber;

connecting a load lock chamber to the transfer chamber, wherein the load lock chamber is exhaustible;

connecting a first gas feed line for feeding an oxygen-based gas to the load lock chamber;

forming a predetermined layer on a wafer in one of the plurality of vacuum processing chambers; and oxidizing the predetermined layer on the wafer in the load lock chamber.

* * * * *